United States Patent [19]

Qureshi et al.

[11] Patent Number: 4,563,657

[45] Date of Patent: Jan. 7, 1986

[54] FREQUENCY SYNTHESIZER AND DIGITAL PHASE LOCK LOOP

[75] Inventors: Shahid U. H. Qureshi, Natick; Yosef Linde, Needham, both of Mass.

[73] Assignee: Codex Corporation, Mansfield, Mass.

[21] Appl. No.: 358,450

[22] Filed: Mar. 15, 1982

[51] Int. Cl.⁴ .............................................. H03L 7/00
[52] U.S. Cl. ....................................... 331/25; 331/14; 375/120
[58] Field of Search ................ 331/10, 14, 25; 328/14, 328/155; 375/11, 120

[56] References Cited

U.S. PATENT DOCUMENTS

| | | | |
|---|---|---|---|
| 3,544,717 | 12/1970 | Smith | 178/69.5 |
| 3,731,210 | 5/1973 | Mollod | 331/10 X |
| 3,883,817 | 5/1975 | Cliff | 331/1 A |
| 4,001,713 | 1/1977 | Egan | 331/1 A |
| 4,019,153 | 4/1977 | Cox, Jr. et al. | 331/1 A |
| 4,029,900 | 6/1977 | Addeo | 178/69.1 |
| 4,044,314 | 8/1977 | Sosin | 331/10 X |
| 4,057,758 | 11/1977 | Juliusburger et al. | 331/1 A |
| 4,190,807 | 2/1980 | Weber | 331/1 A |
| 4,229,824 | 10/1980 | En | 375/119 |
| 4,296,380 | 10/1981 | Minakucki | 328/48 |
| 4,456,890 | 6/1984 | Carickhoff | 331/10 X |

*Primary Examiner*—Eugene R. LaRoche
*Assistant Examiner*—Robert J. Pascal

[57] ABSTRACT

In one aspect the invention features a digital synthesizer having clock circuitry to provide a clock pulse train, synthesizer circuitry to provide a synthesized pulse train at a frequency such that multiple clock pulses occur between pairs of successive synthesized pulses, and phase control circuitry to cause an effective shift in the synthesized pulse train frequency by causing, between pairs of successive synthesized pulses, a number of phase shifts in the clock pulse train.

8 Claims, 13 Drawing Figures

| STATE | OUTPUTS | | |
|---|---|---|---|
| | UP/DOWN | CNTEN | CLREA |
| IDLE | 0 | 0 | 0 |
| UP | 1 | 1 | 0 |
| DOWN | 0 | 1 | 0 |
| LOSS | 0 | 0 | 1 |

FREQUENCY SYNTHESIZER AND DIGITAL PHASE LOCK LOOP

BACKGROUND OF THE INVENTION

This invention relates to electrical circuitry for synthesizing a train of pulses having a desired frequency, useful, e.g., in phase lock loops.

One way of shifting the pulse frequency in such circuitry is to carry out repeated phase shifts of successive pulses. When the pulse train is produced by frequency division of a higher frequency clock, the phase shifts can be accomplished by changing the frequency divisor.

SUMMARY OF THE INVENTION

The invention features, in one aspect, digital synthesizing apparatus including clock circuitry for providing a train of clock pulses, first circuitry responsive to the clock circuitry for providing a train of synthesized pulses at a frequency such that a multiplicity of the clock pulses occurs between pairs of successive synthesized pulses, and second circuitry for causing an effective shift in the frequency of the train of synthesized pulses by causing, between pairs of successive synthesized pulses, a plurality of phase shifts of the train of clock pulses.

In preferred embodiments, the first circuitry includes divider circuitry for dividing the clock pulses by a selectable divisor, and the second circuitry effects each of the phase shifts by changing the value of the selectable divisor; the selectable divisor is 2 when none of the phase shifts is being caused, and each of the phase shifts is caused by changing the selectable divisor from 2 to 1 or from 2 to 3; the phase shifts are caused only within spaced-apart time windows, a plurality of the time windows falling between each pair of successive synthesized pulses, each of the time windows having a duration proportional to a selectable value, the time between consecutive pairs of time windows being inversely proportional to the selectable value; frequency accumulator circuitry is included for providing a value corresponding to the frequency difference between the train of synthesized pulses and a train of reference clock pulses, and the rate of the phase shifts corresponds to that value, whereby the frequency of the train of synthesized pulses is caused to follow the frequency of the train of reference clock pulses; phase discriminator circuitry is included to provide difference signals corresponding to the phase difference between the train of synthesized pulses and the train of reference clock pulses, and there is phase correction circuitry responsive to the phase discriminator circuitry and connected to cause the phase of the train of synthesized pulses to follow the phase of the train of reference clock pulses; and the first circuitry includes frequency register circuitry for holding a selected frequency value, the train of synthesized pulses having an original frequency, when none of the phase shifts is being caused, corresponding to the selected frequency value, and there is offset register circuitry for holding a selectable offset value corresponding to an offset between the original frequency and a desired frequency, the effective shift caused by the phase control circuitry corresponding to the offset, whereby the train of synthesized pulses is caused to have the desired frequency.

In another aspect, the invention features a digital phase locked loop for causing a train of synthesized pulses to track an intermittently received train of reference pulses, the phase locked loop having a phase discriminator for sensing the reference pulses and the synthesized pulses and for providing difference signals corresponding to phase differences between the train of reference pulses and the train of synthesized pulses, an improvement for sensing the loss of the reference pulse train comprising circuitry for inhibiting the difference signals, beginning when at least two synthesized pulses have been sensed without an intervening reference pulse being sensed.

Phase jitter in the train of synthesized pulses is reduced by making a number of phase shifts between synthesized pulses and by making the phase shifts in evenly spaced time windows. The frequency of the reference pulse train is accurately tracked by the synthesized pulse train. Any desired frequency can be synthesized. If the reference pulse is lost, the phase discriminator is temporarily disabled, preventing the phase and frequency of the synthesized clock from wandering.

Other advantages and features of the invention will be apparent from the following description of the preferred embodiment and from the claims.

DESCRIPTION OF THE PREFERRED EMBODIMENTS

We turn now to the structure and operation of the preferred embodiments, first briefly describing the drawings thereof.

STRUCTURE

Figure 1:
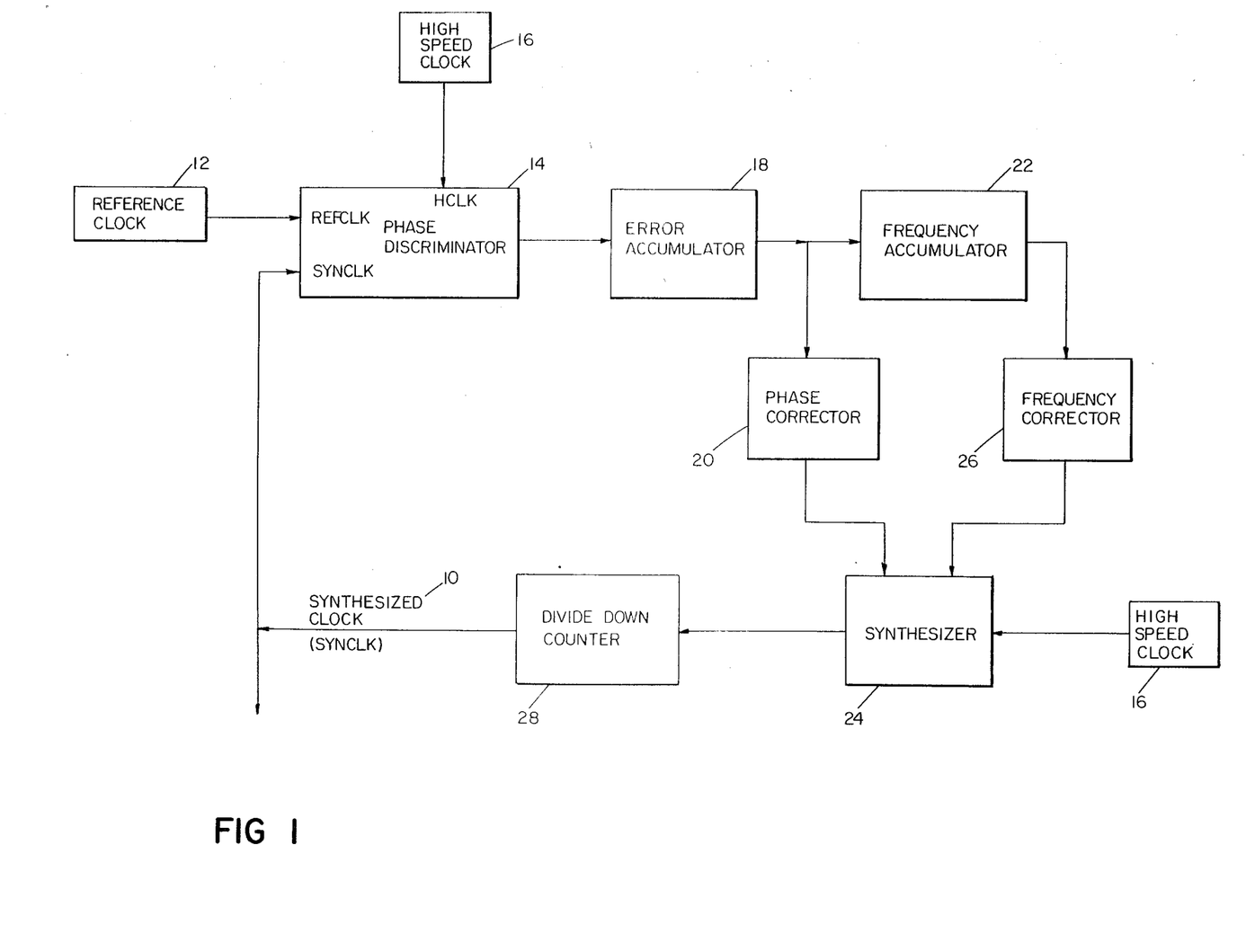
FIG. 1 is a block diagram of a phase-locked loop.

In FIG. 1, which illustrates the overall structure of the digital phase lock loop, clean synthesized clock 10 comprises a train of pulses which generally track, in phase and frequency, the train of pulses of noisy reference clock 12. Phase discriminator 14 samples reference clock 12 and synthesized clock 10 at the frequency ($f_o$) of the pulses of high speed clock 16. Phase discriminator 14 indicates to error accumulator 18 the magnitude and direction of any phase difference between "down" state transitions of the pulses of reference clock 12 and synthesized clock 10, and also indicates when reference clock 12 is temporarily not being received. When the magnitude of the accumulated phase difference exceeds a programmable threshhold, error accumulator 18 provides error signals (indicating the magnitude and direction of error) to phase corrector 20 and frequency accumulator 22. The error accumulator is then reset. When phase corrector 20 receives an error signal, it provides a correction signal to synthesizer 24 at a programmable gain level over the error signal. Frequency accumulator 22 counts the net number of error signals in either direction and when that number exceeds a programmable threshhold (indicating the existence of a frequency error as distinguished from a phase error) frequency accumulator 22 updates the value held in a register to reflect the magnitude and direction of the aggregate frequency correction required at any given time. Based on the value in that register, frequency corrector 26 periodically provides a series of correction pulses to synthesizer 24. Synthesizer 24 generates a clean train of pulses by dividing down the pulses of high-speed clock 16 in a manner which adds or deletes pulses from the train in accordance with the correction pulses from phase corrector 20 and frequency corrector 26. Divide down counter 28 further divides the synthesized pulse train to produce clean synthesized clock 10 having a desired programmable center frequency. Synthesized clock 10 is then available for use elsewhere and also serves as a loop input to phase discriminator 14.

Figure 2:
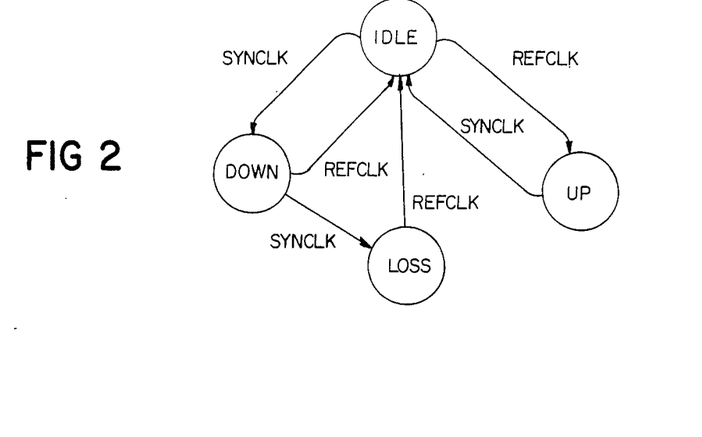
FIG. 2 is a state diagram of the phase discriminator of FIG. 1.
Figure 3:
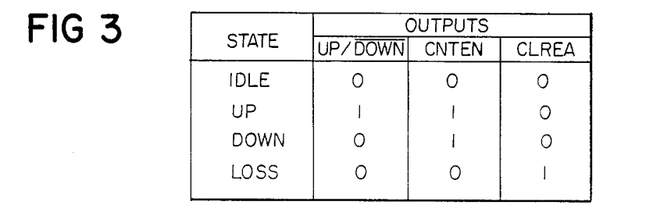
FIG. 3 is a state/output chart of the phase discriminator of FIG. 1.

Phase discriminator 14 could be constructed by one skilled in the art from readily available components based on the state diagram of FIG. 2 and the state/output chart of FIG. 3. Phase discriminator 14 has three inputs (SYNCLK, REFCLK, and HCLK) and three outputs (UP/$\overline{\text{DOWN}}$, CNTEN, and CLREA), and can occupy any one of four states (IDLE, UP, DOWN and LOSS). Inputs REFCLK, SYNCLK, and HCLK are respectively connected to reference clock 12, synthesized clock 10 and high-speed clock 16. Phase discriminator 14 samples the values at inputs SYNCLK and REFCLK with a frequency determined by the frequency ($f_o$) of high-speed clock 16, which is many times greater (e.g., $f_o=8$ megaherz) than the frequency of synthesized clock 10 or of reference clock 12. Phase discriminator 14 determines the occurrence of "down" transitions in the pulses at inputs SYNCLK and REFCLK and compares the times when such transitions occur. As long as there are no transitions at either SYNCLK or REFCLK, or as long as the transitions occur simultaneously (indicating perfect tracking of synthesized clock 10 to reference clock 12) phase discriminator 14 remains in state IDLE as indicated on FIG. 2. When phase discriminator 14 is in state IDLE: if a down transition first occurs on REFCLK, phase discriminator 14 switches to state UP (indicating that reference clock 12 leads synthesized clock 10); while if a down transition first occurs on SYNCLK, phase discriminator 14 switches to state DOWN (indicating that synthesized clock 10 leads reference clock 12). When phase discriminator 14 is in state DOWN or state UP, if the next down transition appears on REFCLK or on SYNCLK, respectively, phase discriminator 14 will return to state IDLE. When phase discriminator 14 is in state DOWN, if the next down transition appears on SYNCLK (indicating that two downward transitions have appeared on SYNCLK without an intervening downward transition on REFCLK, i.e., that REFCLK has been temporarily lost) phase discriminator 14 will switch to state LOSS, where it will remain until a downward transition on REFCLK causes it to return to state IDLE.

FIG. 3 illustrates the values of phase discriminator 14 outputs for each state. In state IDLE, none of the outputs are activated. In state UP, outputs UP/$\overline{\text{DOWN}}$ and CNTEN are activated; in state DOWN, only output CNTEN is activated; and in state LOSS only output CLREA is activated. Accordingly, a signal on output CLREA indicates that reference clock 12 has been temporarily lost; a signal on output CNTEN indicates that a phase error exists; and when a signal appears on CNTEN the value of output UP/$\overline{\text{DOWN}}$ indicates the direction of the required correction. The period of time during which a signal appears on CNTEN indicates the magnitude of the phase error.

Figure 4:
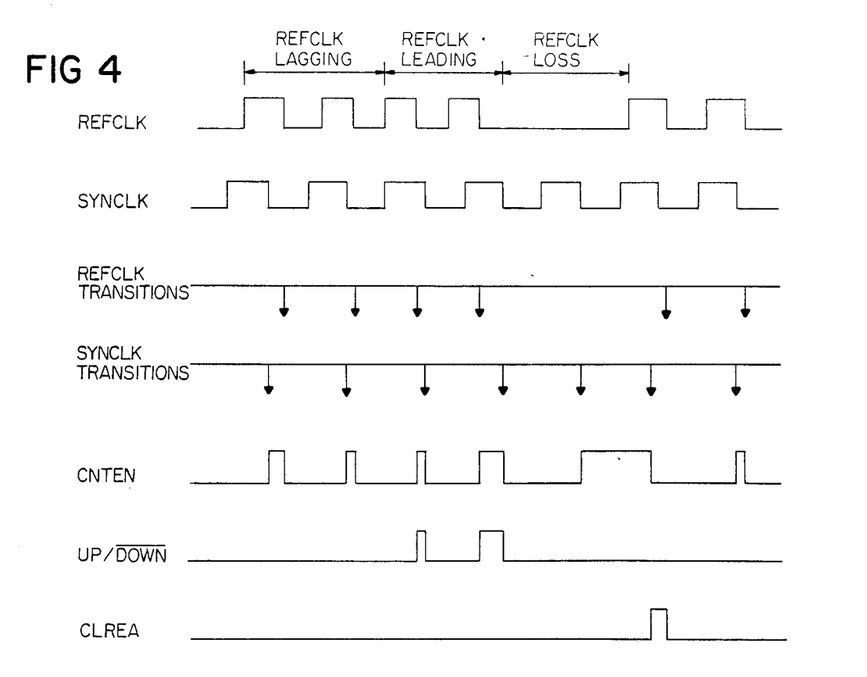
FIG. 4 is a timing chart for the phase discriminator of FIG. 1.

FIG. 4 illustrates the timing of output signals CNTEN, UP/$\overline{\text{DOWN}}$ and CLREA for given input signals REFCLK and SYNCLK, during indicated periods when down transitions on REFCLK lag SYNCLK, when transitions on REFCLK lead SYNCLK, and when REFCLK is temporarily lost. Since the duration of the CNTEN output is proportional to the phase error magnitude and the UP/$\overline{\text{DOWN}}$ output provides the sign of the error, phase discriminator 14 is a linear phase discriminator.

Figure 5:
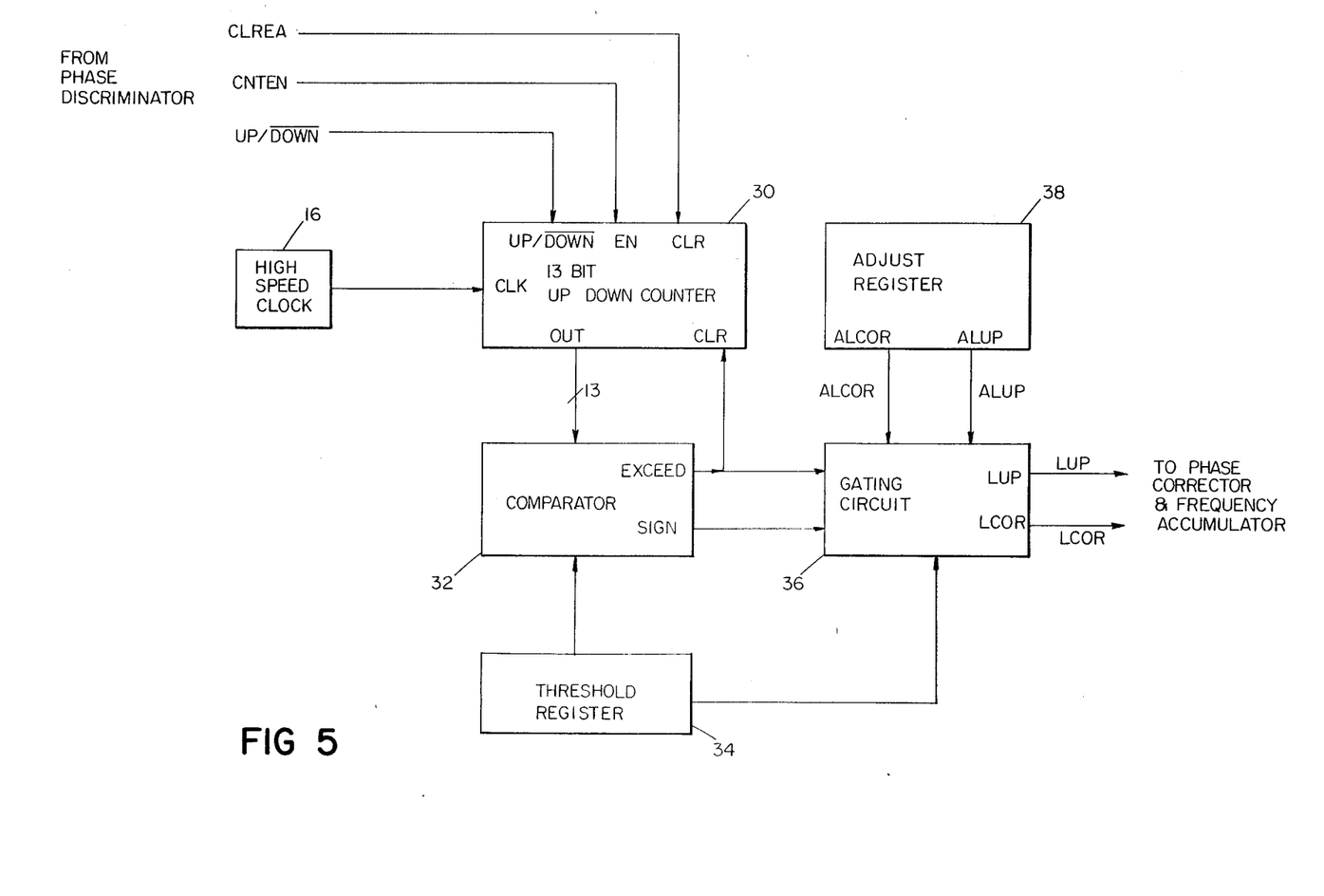
FIG. 5 is a block diagram of the error accumulator of FIG. 1.

As illustrated in FIG. 5, error accumulator 18 has 13-bit up-down counter 30 which counts from zero up and down at a rate governed by the frequency ($f_o$) of high-speed clock 16. When input EN (connected to output CNTEN of phase discriminator 14) is activated (indicating the existence and magnitude of a phase error), counter 30 counts up if input UP/$\overline{\text{DOWN}}$ (connected to output UP/$\overline{\text{DOWN}}$ of phase discriminator 14) is activated, and counts down if input UP/$\overline{\text{DOWN}}$ is not activated. Counter 30 is thus a linear integrator of the phase error. The number in counter 30, which reflects the size and direction of the net phase error between reference clock 12 and synthesized clock 10, appears at output OUT. When the absolute value of the number on output OUT exceeds a threshhold number held in programmable 4-bit threshhold register 34, comparator 32 provides a correction request signal at output EXCEED and a signal representing the direction of the accumulated phase error on output SIGN. Comparator 32 thus indicates when the phase error in either direction exceeds a pre-selected quantity, thereby precluding error corrections to synthesized clock 10 as long as the size of the accumulated phase error fluctuates within programmable threshhold limits. This enables the digital phase lock loop to avoid tracking jitter noise. When the threshhold level is set sufficiently high, the threshhold is never reached and no signals appear on outputs EXCEED and SIGN. Gating circuit 36 normally passes the signals from outputs EXCEED and SIGN to outputs LUP and LCOR, but if the binary number in threshhold register 34 is set to a value higher than 11, gating circuit 36 does not pass the signals from comparator 32; instead the values on outputs ALCOR and ALUP of adjust register 38 are passed to LCOR and LUP respectively, enabling the entry of correction request signals directly from an external source into adjust register 38. When output EXCEED of comparator 32 is activated, input CLR of counter 30 causes counter 30 to be reset to zero and the operation of counter 30 is repeated. Counter 30 is also reset to zero and held at zero when input CLR (connected to output CLREA of phase discriminator 14) is activated (indicating that reference clock 12 has been temporarily lost), which prevents any further correction signals until reference clock 12 has been restored.

Figure 6:
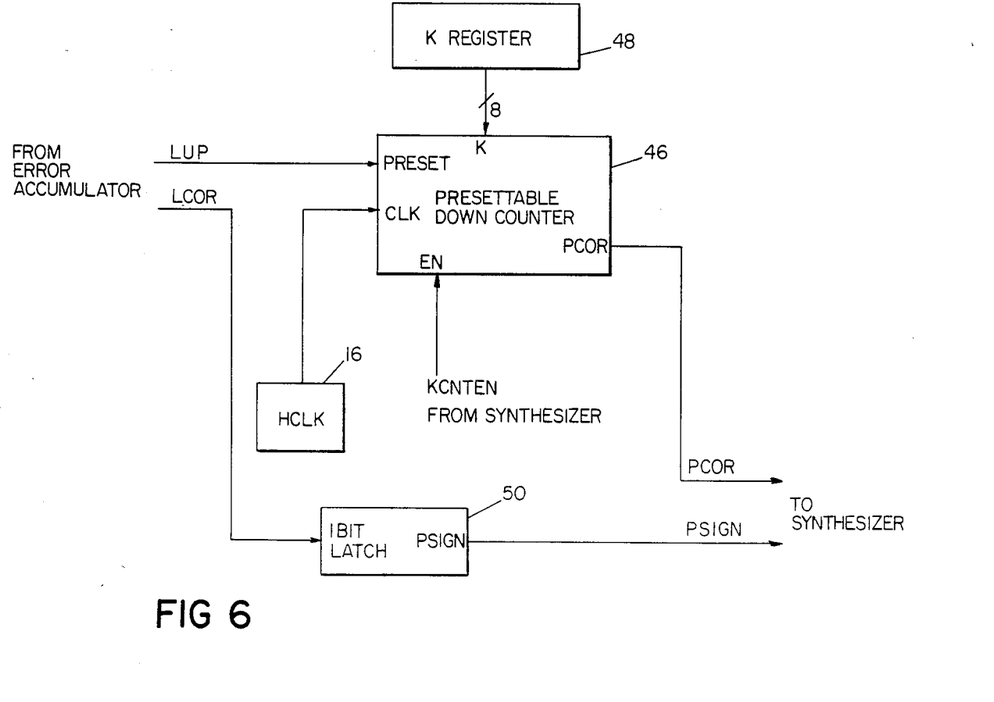
FIG. 6 is a block diagram of the phase corrector of FIG. 1.

As illustrated in FIG. 6, phase corrector 20 has presettable down counter 46 which is preset from 8-bit programmable K-register 48 whenever a phase correction is requested by a signal from output LUP to input PRESET. Counter 46 counts down from the preset number to zero by decrements of 1 each time a phase correction is made by synthesizer 24 as indicated by a signal on input EN of counter 46. As long as the number in counter 46 is not zero, output PCOR continues to be activated. When synthesizer 24 has performed the number of corrections specified by K-register 48, output PCOR is deactivated. The number in K-register 48 is therefore the gain of the phase corrector, i.e., the number of corrections made for each phase correction signal received. The sign of the required phase correction is held in 1-bit latch 50 and asserted on output PSIGN while output PCOR is activated.

Figure 7:
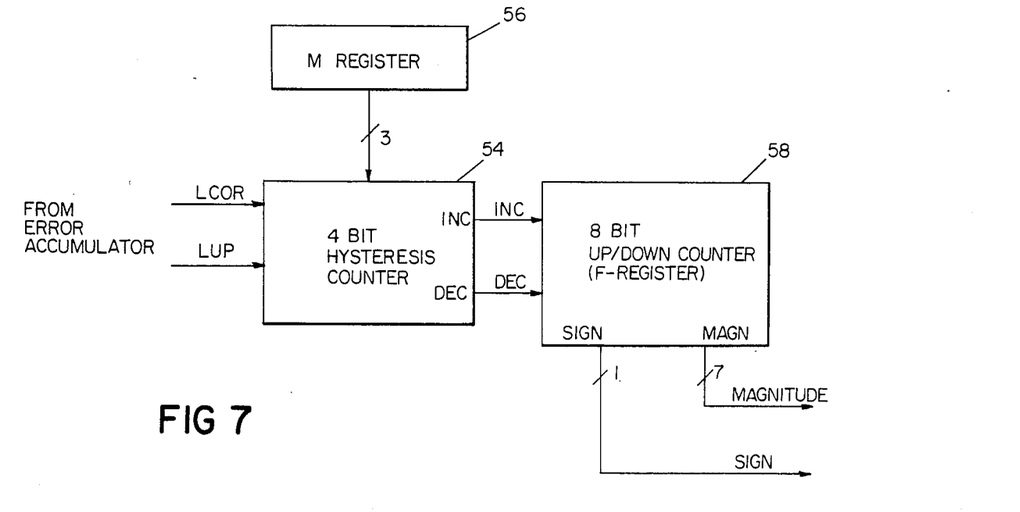
FIG. 7 is a block diagram of the frequency accumulator of FIG. 1.

As illustrated in FIG. 7, frequency accumulator 22 has 4-bit hysteresis counter 54 which counts correction requests (received from output LUP of error accumulator 18) up and down, depending on the direction of the requested correction (indicated on output LCOR of error accumulator 18). As long as the absolute value of the number in counter 54 does not reach a programmable threshold number in 3-bit M-register 56 (indicating that the phase error between reference clock 12 and synthesized clock 10 does not, on average, contain any frequency error component other than the frequency error already being accounted for), outputs INC and DEC remain inactive. If the absolute value of the number in counter 54 reaches the number in M-register 56 (indicating the existence of a consecutive series of phase errors in the same direction, hence implying a frequency error other than frequency errors already being corrected), either output INC or output DEC is activated depending on whether the value in counter 54 is positive or negative, indicating the direction of the frequency error; and counter 54 is then reset to zero. The number in M-register 56 therefore represents a threshhold level of frequency error for corrections to be made (beyond any frequency corrections already being made), and can also affect the frequency correction gain, i.e., the number of frequency corrections made for each unit of frequency error. If M-register 56 is set to zero, frequency accumulator 22 is disabled. Eight-bit up/down counter (F-register) 58 counts up one each time output INC is activated and down one each time output DEC is activated. The number in F-register 58 therefore reflects the aggregate amount and direction of the required frequency correction at any time. F-register 58 can be loaded externally with any selected number representing a frequency offset.

Figure 8:
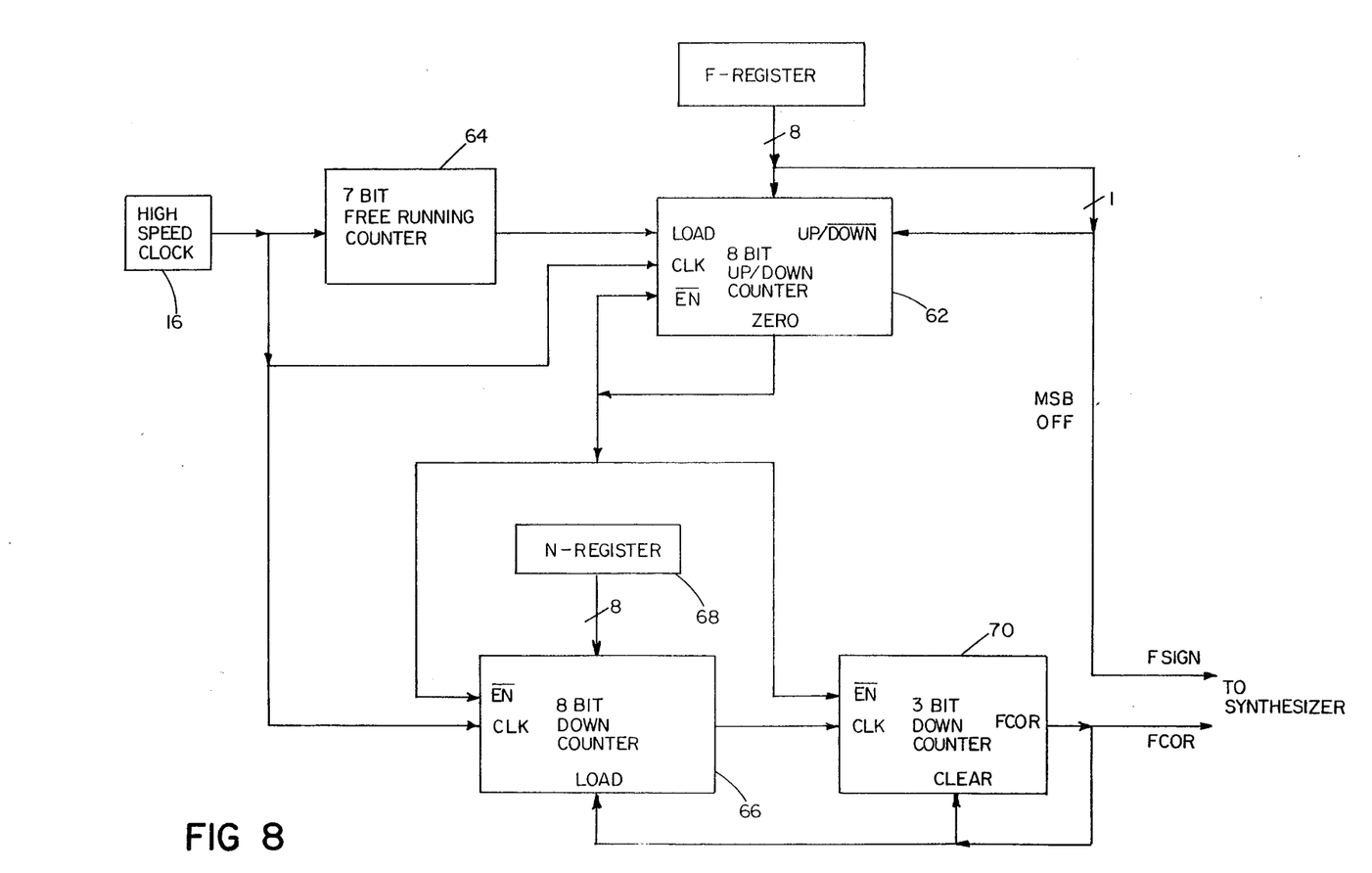
FIG. 8 is a block diagram of the frequency corrector of FIG. 1.

As illustrated in FIG. 8, frequency corrector 26 has 8-bit up-down counter 62, loaded with the 8-bit number in F-register 58 each time input LOAD is activated, which occurs after each 128 pulses of high-speed clock 16, by operation of 7-bit free-running counter 64 (which accordingly defines a series of consecutive equal length time periods). The 8-bit number (F) from F-register 58 is coded by the two's complement method, i.e., positive numbers are held as the eight-bit binary equivalents of 0 through 127 and negative numbers as the eight-bit binary equivalents of 128 through 255, with binary 128 representing $-128$ and binary 255 representing $-1$. Once loaded, counter 62 counts upward if F is negative and downward if F is positive (as indicated at input UP/$\overline{\text{DOWN}}$ by the value of the most significant bit of F) until counter 62 reaches zero. The speed of counting is controlled by the frequency $f_o$ of high-speed clock 16 appearing on input CLK. As long as the number in counter 62 is not zero, no signal is provided on output ZERO. Therefore output ZERO is inactive for a time window having a duration of F pulses of high-speed clock 16 at the beginning of each of consecutive equal length time periods each having a length of 128 pulses of high-speed clock 16. As long as output ZERO is inactivated, input $\overline{\text{EN}}$ is activated and counter 62 is enabled to run; when ZERO becomes activated, $\overline{\text{EN}}$ is deactivated and counter 62 stops running.

Eight-bit down counter 66 is loaded from 8-bit N-register 68 with a programmed number N. Counter 66 divides high-speed clock pulses on input CLK by counting down from N to zero when input $\overline{\text{EN}}$ of counter 66 is activated (which occurs when counter 62 output ZERO is not activated), and provides an output signal each time the number in counter 66 reaches zero. Three-bit down counter 70 divides pulses on its input CLK (from counter 66) by eight as long as its input $\overline{\text{EN}}$ is activated (which occurs when counter 62 output ZERO is not activated). Counter 70 provides pulses on output FCOR each time counter 70 reaches zero. Each time FCOR is activated, input LOAD of counter 66 causes N to be loaded into counter 66. Together counters 66 and 70 therefore provide frequency correction request pulses on FCOR to synthesizer 24 with a frequency of $$\frac{f_o}{8N}$$

and they do so during that portion of each consecutive time period of 128 pulses of high-speed clock 16 which is represented by $$\frac{/F/}{128}$$

(the length of the time window) so that, on the average, frequency correction request pulses are provided with a frequency of $$\frac{f_o}{8N} \cdot \frac{/F/}{128},$$

which is proportional to the required frequency correction F at any given time and can be controlled by N. The most significant bit of F is passed through frequency corrector 26 to synthesizer 24, indicating the direction of frequency correction required. Frequency corrector 26 thus spreads frequency correction request pulses relatively evenly over time, which helps to minimize jitter in synthesized clock 10.

Figure 9:
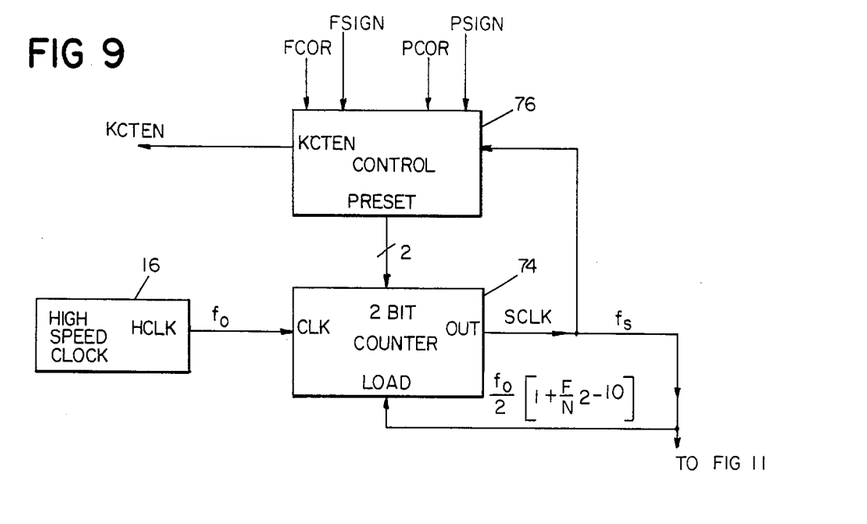
FIG. 9 is a block diagram of the frequency synthesizer of FIG. 1.

As illustrated in FIG. 9, synthesizer 24 has 2-bit counter 74 which divides pulses from high-speed clock 16 appearing on input CLK by 1, 2 or 3 depending on the 2-bit number loaded from output PRESET of control 76. Control 76 normally provides on output PRESET the number 2 when neither a phase correction request appears from output PCOR nor a frequency correction request appears from output FCOR; the number 3 when either output PCOR or output FCOR is activated and the sign on output PSIGN or FSIGN, as the case may be, directs a retardation of the pulses in synthesized clock 10; and the number 1 when the requested change from PCOR or FCOR is to advance the pulses of synthesized clock 10. If FCOR and PCOR are activated at the same time, the frequency correction request is served first. Counter 74 provides the pulse train on output OUT which in turn triggers input LOAD to load the next number from output PRESET into counter 74. Counter 74 also provides a signal on output KCTEN each time a phase correction is signaled on PCOR. The input/output chart for control 76 is as follows:

| Input | | | | Output | |
|---|---|---|---|---|---|
| FCOR | FSIGN | PCOR | PSIGN | PRESET | KCTEN |
| OFF | X | OFF | X | 2 | OFF |
| OFF | X | ON | ADVANCE | 1 | ON |
| OFF | X | ON | RETARD | 3 | ON |
| ON | ADVANCE | X | X | 1 | OFF |
| ON | RETARD | X | X | 3 | OFF |

X = doesn't matter

Figure 10:
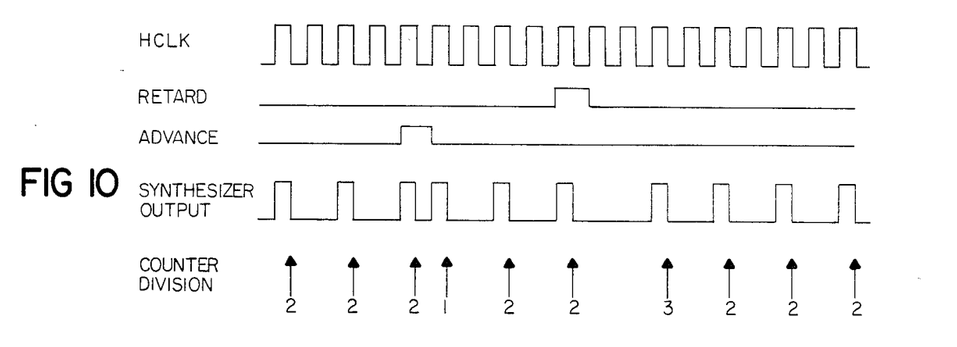
FIG. 10 is a timing diagram of the frequency synthesizer of FIG. 1.

FIG. 10 illustrates the timing of pulses in synthesizer 24. When an advance correction request appears on output PRESET of control 76, counter 74 changes from dividing high-speed clock pulses by 2 to dividing them by 1, and counter 74 output OUT effectively advances the phase of the synthesizer output pulse train by an amount equal to one period of HCLK. When a retard correction request appears on output PRESET, counter 74 divides by 3 and the phase of the synthesizer output pulse train is effectively retarded by an amount equal to one period of HCLK. Required frequency corrections are therefore accomplished by making a number of small phase shifts between pairs of successive synthesized clock pulses.

Figure 11:
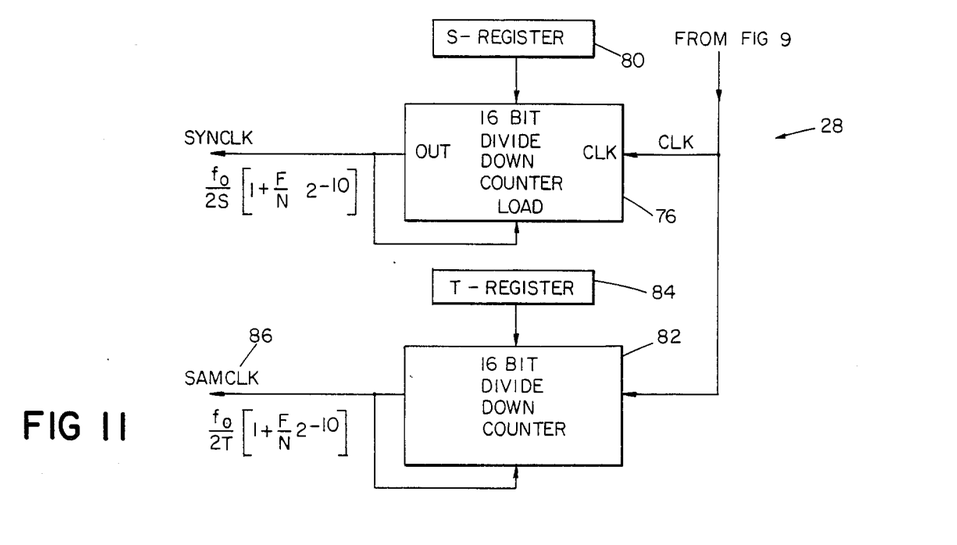
FIG. 11 is a block diagram of the divide down counter of FIG. 1.

As illustrated in FIG. 11, divide down counter 28 has 16-bit divide-down counter 76 which divides the pulses appearing on its input CLK (from synthesizer output OUT) by a 16-bit programmed number loaded from S-register 80. The output of counter 28 is the desired synthesized clock 10, whose center frequency can be programmed on S-register 80. If synthesized clocks of different frequencies are required, additional 16-bit divide down counters (e.g., 82) in combination with additional registers (e.g., 84) will provide the required clocks (e.g., SAMCLK 86).

The frequency of the pulse train appearing at counter 74 output OUT can be determined in the following manner. The rate per second of frequency correction requests on FCOR, as described above, is $$R = \frac{f_o/F/2^{-10}}{N}$$

When F is greater than 0 (indicating that an advance of frequency is required) counter 74 will, R times per second, divide high-speed clock pulses by one, and $(f_o - R)$ times per second will divide by 2 so that the total number of pulses per second ($f_s$) at output OUT when frequency is being advanced is $$f_s = \frac{R}{1} + \frac{f_o - R}{2}$$

$$= \frac{f_o + R}{2}$$

$$= \frac{f_o + \frac{f_o/F/2^{-10}}{N}}{2}$$

$$= \frac{f_o}{2}\left[1 + \frac{/F/2^{-10}}{N}\right]$$

Conversely, if F is less than 0 (indicating that a retardation of frequency is required), counter 74 will, R times per second, divide high speed clock pulses by 3 and $(f_o - 3R)$ times per second will divide by 2 so that the total number of pulses per second ($f_s$) at output OUT when frequency is being retarded is $$f_s = \frac{R}{1} + \frac{f_o - 3R}{2}$$

$$= \frac{f_o - R}{2}$$

$$= \frac{f_o - \frac{f_o/F/2^{-10}}{N}}{2}$$

$$= \frac{f_o}{2}\left[1 - \frac{/F/2^{-10}}{N}\right]$$

Noting that $f_s$ depends on the sign of F, then in both cases (advancing frequency and retarding frequency), $$f_s = \frac{f_o}{2}\left[1 + \frac{F(2)^{-10}}{N}\right]$$

Accordingly, $f_s$ changes linearly with the requested number of frequency changes F. Since F-register 58 is an 8-bit up/down counter, F cannot exceed 128 and the maximum frequency correction (represented by the term $$\left[\frac{F(2)^{-10}}{N}\right]$$

in the above equation) is $$\frac{128 \times 2^{-10}}{N} = \frac{1}{8N} = \frac{12.5\%}{N}$$

Therefore the selection of N controls the percentage of frequency correction, or tracking range, which can be handled by the digital phase lock loop. N also determines the minimum unit of frequency correction which can be made, i.e., $$\frac{2^{-10}}{N}.$$

Expressed as a percentage of center frequency $f_o$, the resolution is approximately $$\frac{1}{10N}\%.$$

Finally, as explained earlier, N also governs the frequency correction gain by controlling the number of corrections made for each unit of frequency error.

OPERATION

In operation, a noisy reference clock having a nominal center frequency is provided. The phase of the reference clock can shift ahead or back from time to time; and the shifts can vary randomly back and forth within acceptable limits or can accumulate into a long term larger shift. The digital phase lock loop provides one or more synthesized clocks of different frequencies but in phase such that each clock generally tracks the reference clock in phase and frequency but filters out the minor fluctuations in frequency and phase known as jitter noise.

In operation with a given reference clock, N-register 68 is programmed to provide the desired tracking range, resolution and frequency correction gain; S-register 80 and T-register 84 are programmed to provide the desired center frequencies; and threshold register 34 is programmed to provide the desired degree of jitter elimination. Initially, M-register 56 is set to zero, which prevents any frequency corrections, and K-register 48 is set relatively high to provide rapid coarse phase alignment. K-register 48 is then reduced to refine the phase alignment, and a number is loaded into M-register 56 to enable frequency corrections to be made. This procedure eliminates initial overshoots which could result from frequency offset accumulations due to an initially large phase error.

When only minor shifts in phase occur, corrections in the synthesized clocks are prevented by the thresholding effect of threshold register 34. When a significant phase shift occurs, one-time corrections are requested whose number reflects the programmed phase gain in K-register 48. Phase errors are also accumulated in the frequency accumulator, and when sufficient errors in one direction (governed by the threshholding effect of M-register 56) occur, indicating a frequency shift beyond any frequency shift already accounted for, the current amount of frequency correction required, held in F-register 58, is updated. Frequency correction requests are distributed relatively evenly among consecutive time periods of 128 high speed clock pulses each. Frequency correction requests are issued only during a time window within each time period, each time window having a duration corresponding to F. The number of frequency correction requests issued in each time window depends on programmed value N, which governs the frequency gain, the resolution and the tracking range of the frequency corrections. Corrections are effected as small phase shifts by dividing high speed clock 16 by 2 if no corrections are requested, by 1 if a phase advance or higher frequency is requested, and by 3 if a phase retardation or lower frequency is requested. The resulting pulse train is further divided down by a number controlled by programmable S-register 80 and T-register 84 to produce the required clean synthesized clocks.

By the use of programmed thresholds any desired degree of jitter elimination is possible. The spreading of frequency correction requests essentially evenly over time reduces the amount of jitter in the synthesized clock.

Figure 12:
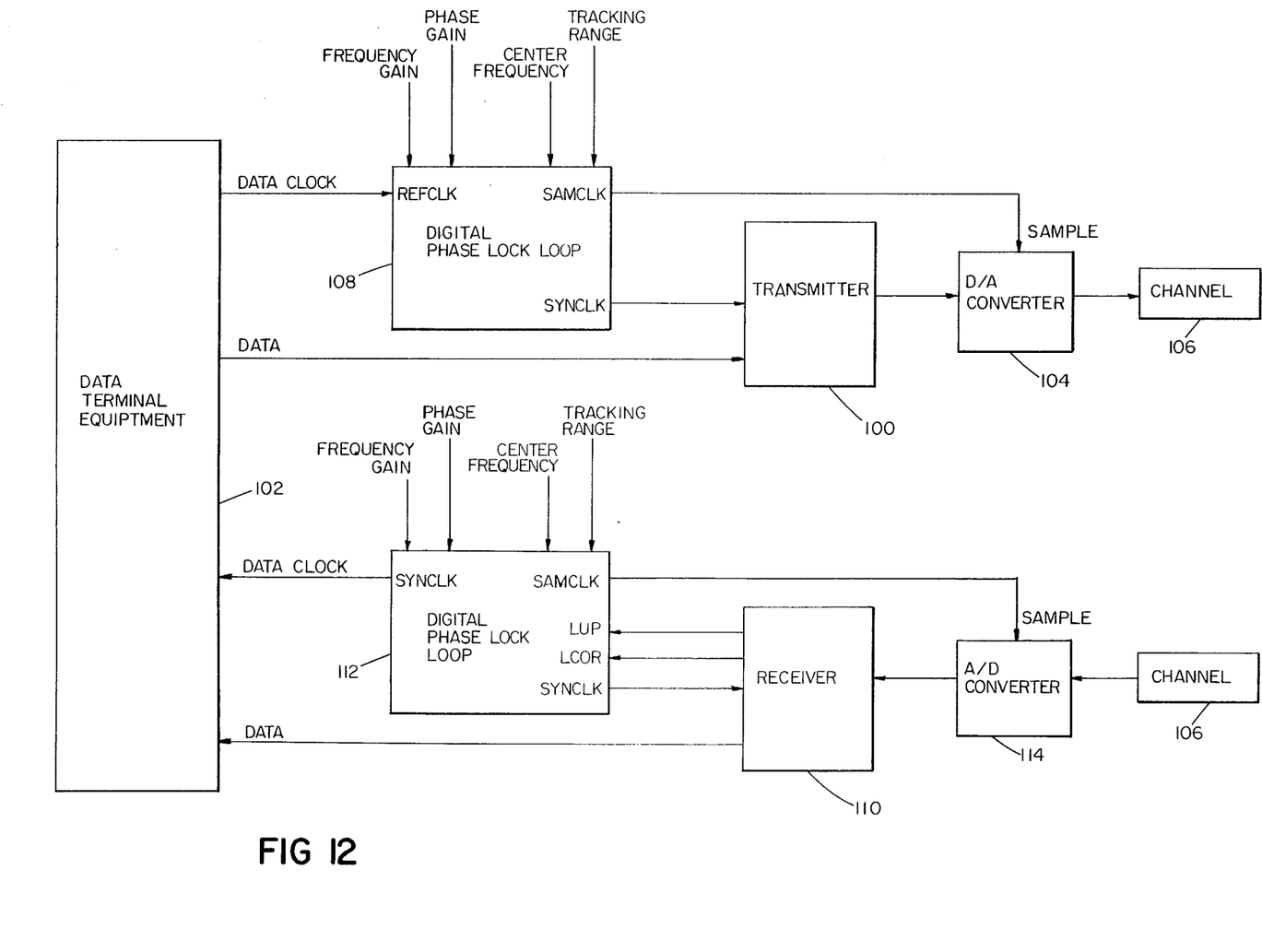
FIG. 12 is a block diagram of a modem application using the phase locked loop of FIG. 1.

FIG. 12 illustrates one application of the invention in a modem for use in transmitting and receiving data over a channel. In FIG. 12, transmitter 100 delivers digital data from data terminal equipment 102 to digital-to-analog converter 104 to be sampled and converted to analog form for transmission on channel 106. Digital phase lock loop 108 receives a noisy reference clock on input REFCLK and provides a clean synthesized clock on output SAMCLK which controls the sampling rate of converter 104, and a second clean synthesized clock on output SYNCLK which is provided to transmitter 100 for transmission over channel 106. Digital phase lock loop 108 is programmed, as described above, with the desired frequency gain, phase gain, center frequency and tracking range. The frequencies of the two synthesized clocks are different but they are locked in phase.

In the receiving mode, no reference clock is available, but receiver 110 provides signals on inputs LUP and LCOR of digital phase lock loop 112 to indicate the direction and magnitude of the phase error of a noisy clock received on channel 106. Digital phase lock loop 112 then provides clean, synthesized clocks on outputs SYNCLK and SAMCLK to data terminal equipment 102 and analog-to-digital converter 114 respectively.

Figure 13:
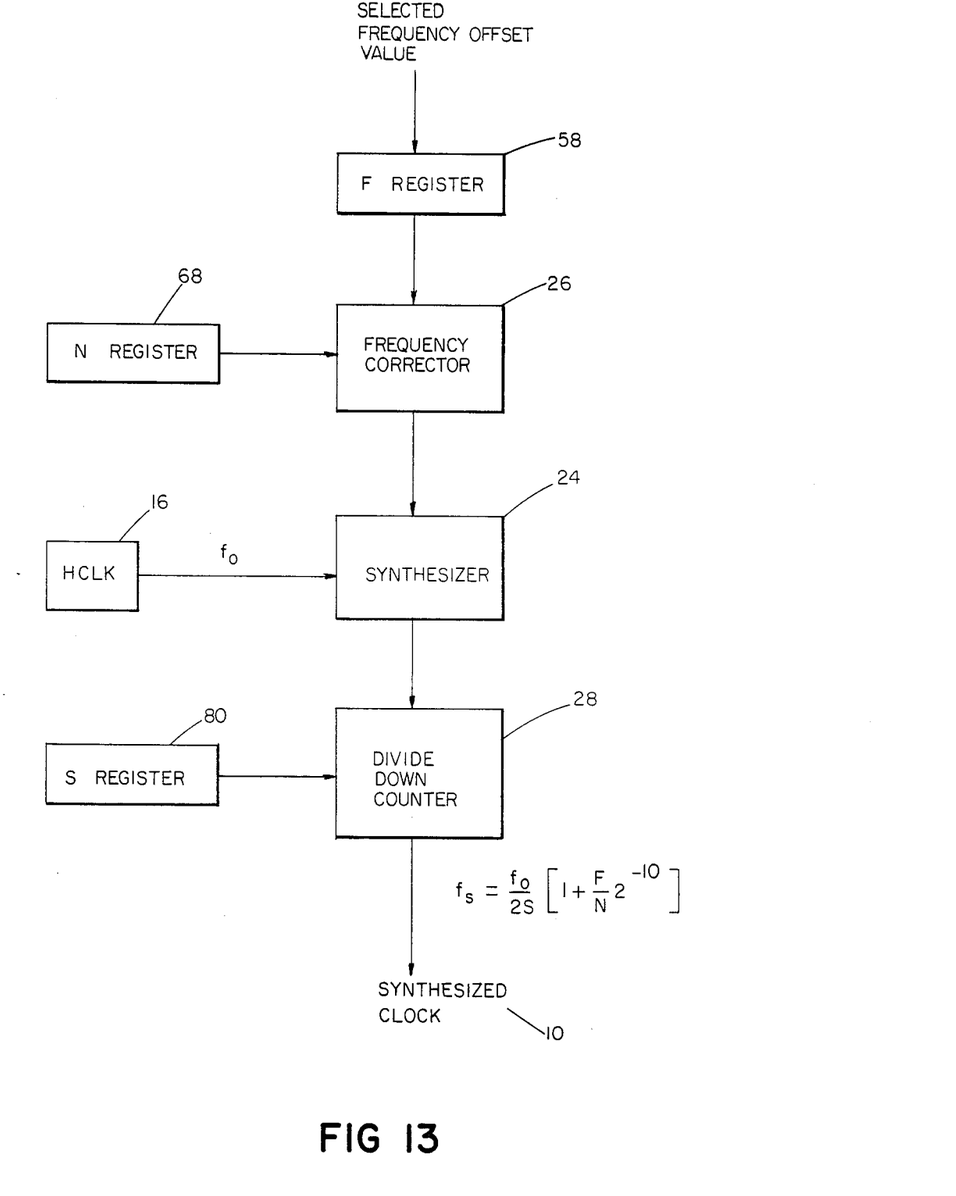
FIG. 13 is a block diagram of a frequency synthesizer.

Other embodiments are within the following claims. E.g., referring to FIG. 13, F-register 58 (programmable by a selected frequency offset value), frequency corrector 26, N-register 68, synthesizer 24 (driven by high-speed clock 16 of selected frequency $f_o$), S register 80 and divide down counter 28 are connected as shown to provide a synthesized clock 10 (having a desired frequency $f_s$). By selecting $f_o$ and S (the value programmed into S-register 80) at appropriate values to provide a synthesized clock 10 having a frequency close to the desired frequency, and by loading the F-register with an appropriate frequency offset value and the N-register with an appropriate value, frequency $f_s$ can be made to have any desired value satisfying the relationship:

$$f_s = \frac{f_o}{2S}\left[1 + \frac{F}{N} 2^{-10}\right]$$

We claim:
1. Apparatus for synthesizing a train of pulses at a desired frequency comprising
   first circuitry for providing signals that represent a first pulse train having a first frequency higher than said desired frequency,
   divide down circuitry responsive to said first circuitry for providing a synthesized pulse train at a lower frequency than said first frequency, and
   second circuitry for changing the frequency of said synthesized pulse train to said desired frequency by modifying said representative signals so that the first pulse train which they represent undergoes a plurality of phase shifts during the time that elapses between successive pulses of said synthesized pulse train.
2. The apparatus of claim 1 wherein
   said first circuitry comprises
      clock circuitry for providing a train of clock pulses, and
      counter circuitry for dividing the number of said clock pulses by a selectable divisor, and
   said second circuitry is connected to said first circuitry, for causing said first circuitry to effect each one of said phase shifts by changing the value of said selectable divisor.

3. The apparatus of claim 2 wherein said selectable divisor is 2 when none of said phase shifts is being caused, and each one of said phase shifts is caused by changing said selectable divisor from 2 to 1 or from 2 to 3.

4. The apparatus of claim 1 wherein said phase shifts are caused only within spaced-apart time windows, a plurality of said time windows falling between each of said pairs of successive synthesized pulses, each of said time windows having a duration proportional to a selectable value, the time between consecutive pairs of said time windows being inversely proportional to said selectable value.

5. The apparatus of claim 1, 2, 3 or 4 further comprising
frequency accumulator circuitry for providing a value corresponding to the frequency difference between said train of synthesized pulses and a train of reference clock pulses,
and wherein the rate of said phase shifts corresponds to said value,
whereby the frequency of said train of synthesized pulses is caused to follow the frequency of said train of reference clock pulses.

6. The apparatus of claim 5 further comprising
phase discriminator circuitry connected to provide difference signals corresponding to the phase difference between said train of synthesized pulses and said train of reference clock pulses, and
phase correction circuitry responsive to said phase discriminator circuitry and connected to cause the phase of said train of synthesized pulses to follow the phase of said train of reference clock pulses.

7. The apparatus of claim 1, 2, 3 or 4 wherein
said divide down circuitry comprises
frequency register circuitry for holding a selected frequency value corresponding to said lower frequency, and
said apparatus further comprises offset register circuitry for holding a selectable offset value corresponding to an offset between said lower frequency and said desired frequency, and
the change of frequency of said synthesized pulse train caused by said second circuitry corresponds to said offset,
whereby said train of synthesized pulses is caused to have said desired frequency.

8. In a digital phase locked loop for causing a train of synthesized pulses to track an intermittently received train of reference pulses, said phase locked loop having a phase discriminator for sensing said reference pulses and said synthesized pulses and for providing difference signals corresponding to phase differences between said train of reference pulses and said train of synthesized pulses,
an improvement for sensing the loss of said train of reference pulses comprising circuitry for inhibiting said difference signals, beginning when at least two said synthesized pulses have been sensed without an intervening reference pulse being sensed.

* * * * *